United States Patent
Aisenbrey

(10) Patent No.: US 7,136,008 B2
(45) Date of Patent: Nov. 14, 2006

(54) LOW COST ELECTROMAGNETIC ENERGY ABSORBERS MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 39 days.

(21) Appl. No.: 10/884,321

(22) Filed: Jul. 2, 2004

(65) Prior Publication Data

US 2005/0001780 A1   Jan. 6, 2005

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/484,448, filed on Jul. 2, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
  *H01Q 17/00* (2006.01)
  *B65B 53/00* (2006.01)
  *F16B 4/00* (2006.01)
  *B32B 3/00* (2006.01)
  *B32B 3/26* (2006.01)

(52) U.S. Cl. .................. 342/4; 428/34.9; 428/313.5

(58) Field of Classification Search ............. 343/873; 342/1–4; 428/313.5, 316, 34.9, 357
See application file for complete search history.

(56) References Cited

U.S. PATENT DOCUMENTS

| | | | | |
|---|---|---|---|---|
| 3,576,387 A | * | 4/1971 | Derby | 174/36 |
| 4,434,541 A | * | 3/1984 | Powers, Jr. | 361/1 |
| 4,471,015 A | | 9/1984 | Ebneth et al. | 428/195 |
| 4,634,615 A | * | 1/1987 | Versteegh et al. | 138/141 |
| 4,803,103 A | * | 2/1989 | Pithouse et al. | 428/34.5 |

(Continued)

FOREIGN PATENT DOCUMENTS

GB    2377449 A    7/2001

OTHER PUBLICATIONS

Co-pending U.S. Patent, filed Dec. 4, 2002, U.S. Appl. No. 10/309,429, "Low Cost Antennas Using Conductive Plastics or Conductive Composites," assigned to the same assignee.

*Primary Examiner*—Don Wong
*Assistant Examiner*—Marie Antoinette Cabucos
(74) *Attorney, Agent, or Firm*—Douglas Schnabel

(57) ABSTRACT

Electromagnetic energy absorbing devices are formed of a conductive loaded resin-based material. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

60 Claims, 9 Drawing Sheets

U.S. PATENT DOCUMENTS

| | | | |
|---|---|---|---|
| 4,921,751 A * | 5/1990 | Wakahara et al. | 442/189 |
| 5,106,437 A * | 4/1992 | Lau et al. | 156/51 |
| 5,413,694 A | 5/1995 | Dixon et al. | 205/158 |
| 5,470,622 A * | 11/1995 | Rinde et al. | 428/34.9 |
| 6,007,905 A * | 12/1999 | Kudo et al. | 428/313.5 |
| 6,359,581 B1 * | 3/2002 | Kurihara et al. | 342/4 |
| 6,479,140 B1 | 11/2002 | Takao et al. | 428/317.9 |
| 2002/0037376 A1 * | 3/2002 | Fenton | 428/34.9 |
| 2003/0108744 A1 | 6/2003 | Kuchlev et al. | 428/403 |
| 2003/0117787 A1 | 6/2003 | Nakauchi | 361/818 |
| 2003/0119459 A1 | 6/2003 | Carillo, Jr. et al. | 455/114 |
| 2003/0146866 A1 | 8/2003 | Hayashi et al. | 342/1 |
| 2003/0198800 A1 | 10/2003 | Hoffman | 428/323 |
| 2004/0020674 A1 | 2/2004 | McFadden et al. | 174/35 MS |

* cited by examiner

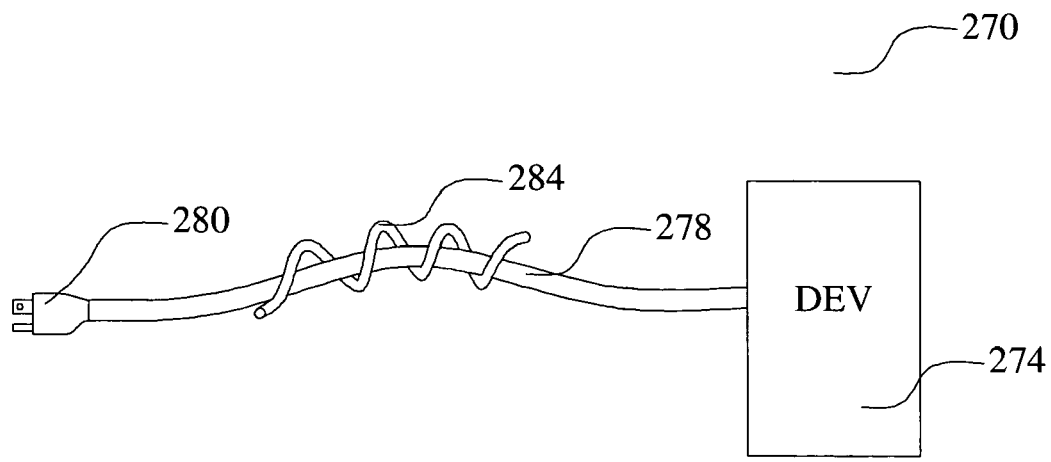
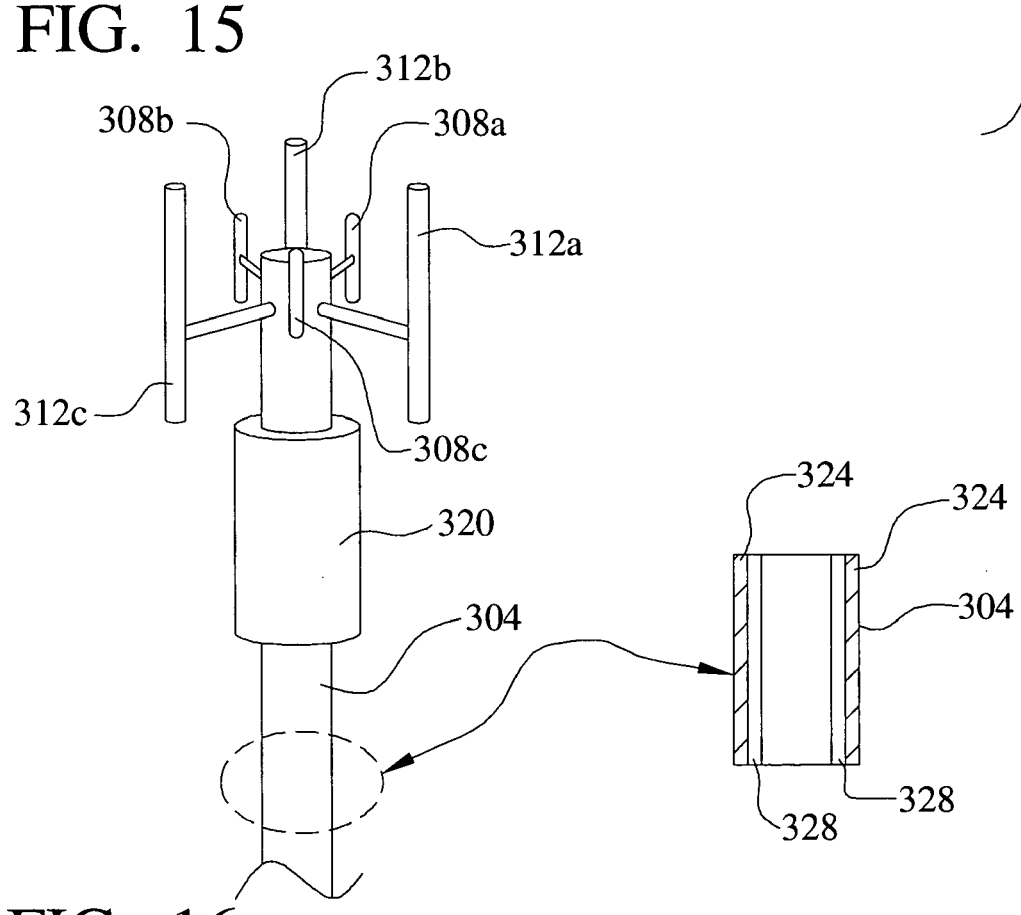
FIG. 15
FIG. 16

US 7,136,008 B2

LOW COST ELECTROMAGNETIC ENERGY ABSORBERS MANUFACTURED FROM CONDUCTIVE LOADED RESIN-BASED MATERIALS

This Patent Application claims priority to the U.S. Provisional Patent Application 60/484,448 filed on Jul. 2, 2003, which is herein incorporated by reference in its entirety.

This Patent Application is a Continuation-in-Part of U.S. patent application Ser. No. 10/309,429, filed on Dec. 4, 2002 now U.S. Pat. No. 6,870,516, also incorporated by reference in its entirety, which is a Continuation-in-Part application of U.S. patent application Ser. No. 10/075,778, filed on Feb. 14, 2002 now U.S. Pat No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to electromagnetic energy absorbers and, more particularly, to electromagnetic energy absorbers molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

Electromagnetic energy is an important consideration in the art of electrical and electronic devices, and particularly in the art of communications devices. A normally operating electronic device will typically emit significant amounts of stray electromagnetic energy due electrical charge accelerations occurring in the device. This energy radiates out from the device at the speed of light. The vast majority of this energy is simply dissipated in the surrounding atmosphere. However, if another electronic device is operating near the radiating device, then a part of the radiated energy may well intersect with this second device. This electromagnetic energy, in the form of electric and magnetic fields, can interact with the second electronic device to create interference. That is, the electromagnetic energy becomes an unwanted, interference signal in the second device. This interaction is called electromagnetic interference (EMI) or radio frequency interference (RFI).

From the standpoint of electrical and electronic design, the electromagnetic energy interactions in the above-described scenario create two broad considerations. First, proposed designs must take into account the electromagnetic energy environment in which the proposed devices will operate. Much as the design must take into account the operating temperature range, so the design must also take into account the range of frequencies, magnitudes, and durations of electromagnetic sources in the operating environment. While the above discussion describes the case of electromagnetic radiation emanating from a nearby device, other potential sources must also be accounted for. For example, electrical power grids, passing motor vehicles, cellular mobile phones, personal computers, and other man-made devices all emit electromagnetic energy during normal operation. Further, natural sources, such as the sun, generate electromagnetic energy that can create signal interference in the proposed device. Any of these sources in the operating environment can generate electromagnetic energy that can be coupled into the proposed device through cables, circuit board traces, or routing, connectors, packaging, materials, and the like.

Second, the design must take into account the electromagnetic energy that can be emitted from the proposed device through the operating circuits, devices, routings, connectors, cables, and the like. It is not sufficient to simply 'bullet proof' the proposed design from outside interference. The design must also meet specifications limiting the content of the electromagnetic energy emitted from the device. These specifications are developed to insure that all systems in the overall operating environment function properly. Further, these specifications may be promulgated by government or regulatory agencies and carry the force of legal requirements. For example, the U.S. Federal Communications Commission establishes guidelines limiting the content of electromagnetic energy emissions for various types of manufactured devices sold in the U.S. Market in order to protect publicly accessed communications frequencies.

The above described considerations are most pronounced in devices that use electromagnetic energy to perform a critical function. For example, a radar tracking system installed on a naval ship transmits pulses of intense electromagnetic energy and then monitors, or receives, components of this energy that are reflected back to the ship by solid objects, such as other ships. This type of radar tracking system may be adversely affected by interactions between the transmitted radar energy and structures on the ship such as masts, towers, artillery tubes, and the like. As a result, significant degradation in tracking ability may occur. In this scenario, and in many wireless communication scenarios, the design must trade off the need for large and well-defined electromagnetic energy levels required for transmitting data or for detection waves with the need to limit the power of transmitted energy to avoid EMI/RFI issues or to avoid health concerns. Further, the design must trade off the need to detect weak electromagnetic signals with the need to block other signals.

The above-described considerations have resulted in the creation in the art of numerous structures, techniques, and methods to handle EMI/RFI issues experienced in the field. Further, with the advent of careful government regulation and of customer specification, the analysis and testing of electromagnetic capabilities in manufactured devices is now an important consideration. Testing, such as measuring the effect of a well-defined interference signal or pattern impinging on a device, requires equipment and facilities to carefully generate a specified set of conditions, such as signal strength and frequency, and to measure the response of a device under test (DUT) to those conditions. Anechoic chambers have been constructed wherein the interior spaces are carefully shielded from external sources of electromagnetic energy. Further, electromagnetic energy radiating from sources inside the anechoic chambers, such as radiating test antennas or even the DUT, itself, is quickly absorbed. A number of structures, devices, and methods have been developed for testing electromagnetic energy issues.

Several prior art inventions relate to devices or materials to control electromagnetic energy. U.S. Patent Publication U.S. 2003/0117787 A1 to Nakauchi teaches a shield for reducing radio frequency (RF) interference associated with an electronic circuit. U.S. Patent Publication U.S. 2004/0020674 A1 to McFadden et al teaches a composite EMI shield comprising a conductive layer and an absorptive layer. The conductive layer in this invention is selected from the group consisting of silver, nickel, copper, aluminum, steel, silver/glass, graphite, carbon, conductive polymers, and combinations thereof. The absorptive layer is then applied by spraying or dipping an electromagnetic energy absorptive particle onto the conductive layer. U.S. Pat. No. 6,479,140 B1 to Takao et al teaches radio wave absorbing materials comprising conductive filler, an inorganic endothermic filler, and an organic binder as main constituents. The preferred conductive filler in this invention is carbon black. U.S. Pat. No. 6,007,905 to Kudo et al teaches a wave absorber comprising a layer of a foamed thermoplastic organic polymer, a conductive layer, and a third layer of the foamed thermoplastic organic polymer. The conductive layer that is taught in this invention is a mixture of a conductive carbon black, conductive graphite, and a latex of a thermoplastic organic polymer. U.S. Patent Publication U.S. 2003/0198800 A1 to Hoffman teaches a sheet like plastic element for the confinement of high frequency reflections. Electrically conductive particles are mixed into polyurethane backing material.

U.S. Patent Publication U.S. 2003/0146866 A1 to Hayashi et al teaches a radio wave absorber unit for use in an anechoic chamber. This invention teaches a polypropylene-based conductive expanded bead for the substrate material with the beads ranging in size from 2 mm to 10 mm. U.S. Patent Publication U.S. 2003/0108744 A1 to Kuchler et al teaches the use of highly porous glass granulate and/or ceramic granulate coated with ferrite and/or an electrically conductive material as a filler in the production of an electromagnetic absorber material. This filler is mixed with mortar and used for forming walls or absorber linings or housings. U.S. Patent Publication U.S. 2003/0119459 A1 to Carillo et al teaches the use of an electromagnetic field shield that is reflective, absorptive or dissipative in nature, to block a direct line-of-sight electromagnetic field radiating from an antenna of a wireless device. U.S. Pat. No. 6,359,581 B2 to Kurihara et al teaches an electromagnetic wave absorber for use in an anechoic chamber. The absorber includes a wave absorbing section comprising an array of plate-shaped elements of magnetic loss material where the spaces between each plate-shaped element comprise a dielectric loss material. The magnetic loss material may comprise a resin containing ferrite powder. The dielectric loss material may comprise a foam, or a resin, containing carbon or graphite.

SUMMARY OF THE INVENTION

A principal object of the present invention is to provide effective electromagnetic energy absorbers.

A further object of the present invention is to provide a method to form electromagnetic energy absorbers.

A further object of the present invention is to provide electromagnetic energy absorbers molded of conductive loaded resin-based materials.

A yet further object of the present invention is to provide electromagnetic energy absorbers molded of conductive loaded resin-based material where the electromagnetic energy absorbers characteristics can be altered or the visual characteristics can be altered by forming a metal layer over the conductive loaded resin-based material.

A yet further object of the present invention is to provide methods to fabricate electromagnetic energy absorbers from a conductive loaded resin-based material incorporating various forms of the material.

A yet further object of the present invention is to provide a method to fabricate electromagnetic energy absorbers from a conductive loaded resin-based material where the material is in the form of a fabric.

In accordance with the objects of this invention, an electromagnetic energy absorbing device is achieved. The device comprises a conductive loaded, resin-based material comprising conductive materials in a base resin host. The conductive materials comprise between about 20% and about 50% of the total weight of the conductive loaded resin-based material.

Also in accordance with the objects of this invention, an electromagnetic energy absorbing device is achieved. The device comprises a conductive loaded, resin-based material comprising conductive materials in a base resin host. The conductive materials comprise between about 20% and about 50% of the total weight of the conductive loaded resin-based material. The conductive materials comprise micron conductive fibers.

Also in accordance with the objects of this invention, a method to form a resistive element device is achieved. The method comprises providing a conductive loaded, resin-based material comprising conductive materials in a resin-based host. The conductive loaded, resin-based material is molded into an electromagnetic energy absorbing device.

BRIEF DESCRIPTION OF THE DRAWINGS

In the accompanying drawings forming a material part of this description, there is shown:

FIG. 15 illustrates a tenth preferred embodiment of the present invention showing the application of an electromagnetic energy absorber comprising a conductive loaded resin-based material to reduce interference on a power cord.

FIG. 16 illustrates an eleventh preferred embodiment of the present invention showing the application of an electromagnetic energy absorber comprising a conductive loaded resin-based material to a communications antenna.

DESCRIPTION OF THE PREFERRED EMBODIMENTS

Figure 1:
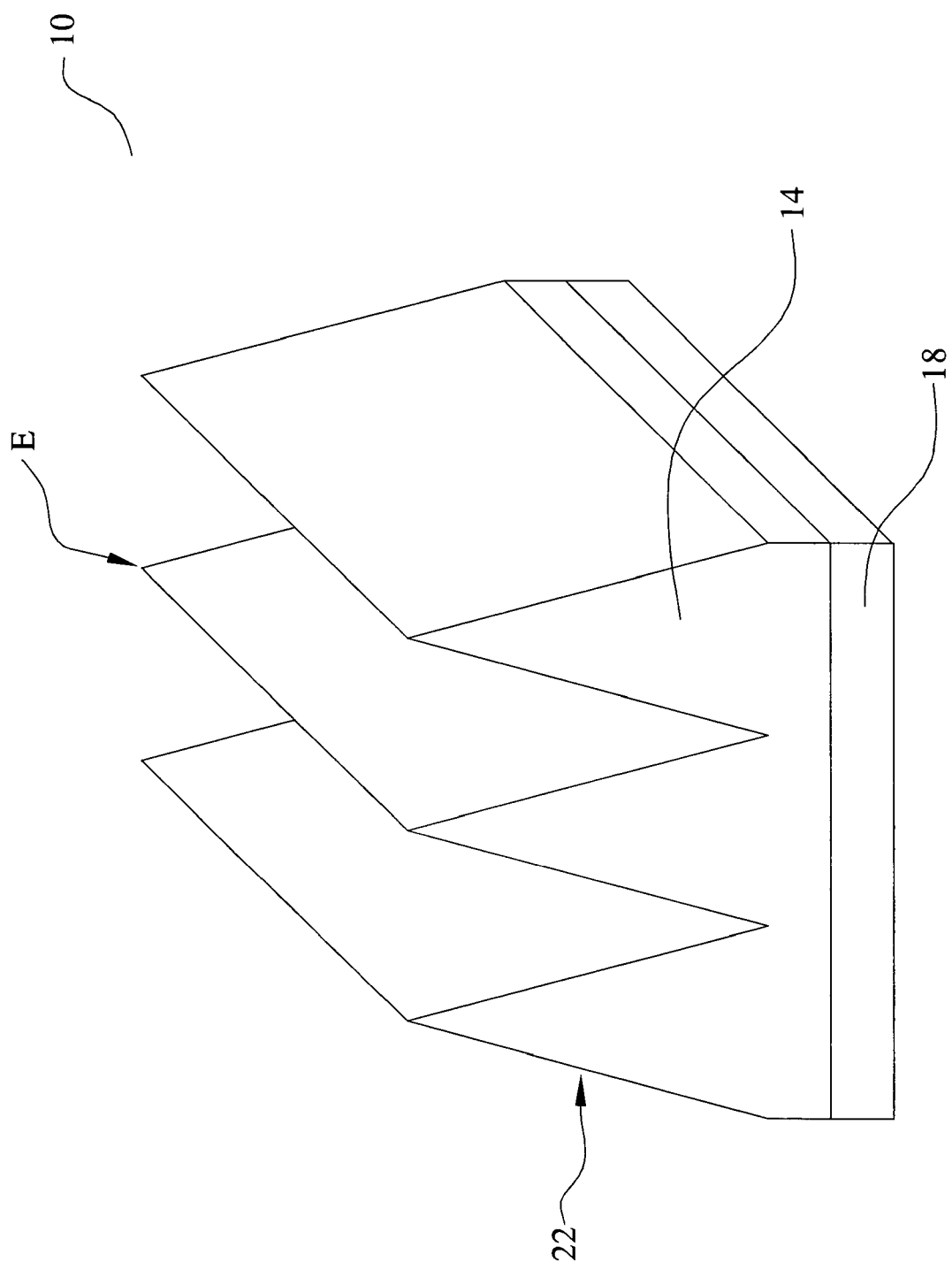
FIG. 1 illustrates a first preferred embodiment of the present invention showing pyramidal electromagnetic energy absorbers comprising a conductive loaded resin-based material.

This invention relates to electromagnetic energy absorbers molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of electromagnetic energy absorbers fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the electromagnetic energy absorber devices are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of electromagnetic energy absorbers significantly lowers the cost of materials and the design and manufacturing processes used to hold ease of close tolerances, by forming these materials into desired shapes and sizes. The electromagnetic energy absorbers can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the electromagnetic energy absorbers and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming electromagnetic energy absorbers that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in electromagnetic energy absorbers applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, electromagnetic energy absorbers manufactured from the molded conductor loaded resin-based material can provide added thermal dissipation capabilities to the application. For example, heat can be dissipated from electrical devices physically and/or electrically connected to electromagnetic energy absorbers of the present invention.

As a significant advantage of the present invention, electromagnetic energy absorbers constructed of the conductive loaded resin-based material can be easily interfaced to an electrical circuit or grounded. In one embodiment, a wire can be attached to conductive loaded resin-based electromagnetic energy absorbers via a screw that is fastened to the electromagnetic energy absorber. For example, a simple sheet-metal type, self tapping screw can, when fastened to the material, achieves excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw that is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the electromagnetic energy absorbers and a grounding wire.

Referring now to FIG. 1, a first preferred embodiment 10 of the present invention is illustrated. Several important features of the present invention are shown and discussed below. In this embodiment, a pyramidal shaped absorber 14 is formed of the conductive loaded resin-based material of the present invention. This type of absorbing structure is particularly useful in anechoic testing chambers to absorb high level electromagnetic energy and to convert this energy to heat.

The apexes of the pyramids are oriented toward the energy source (E). Incident energy waves encounter a graded dielectric, because of the shape 22 of the absorber 14, such that the impedance gradually tapers from that of free space to that of the absorber 14. Further, the absorber 14 has a high dielectric content that creates a lossy media for transport of the electromagnetic energy. The smooth transition from free space (air) to absorber space 14 results in little reflection of the incident energy. As a result, the incident wave is mostly absorbed into the structure 14. As the wave traverses the structure, the high dielectric level results in significant conversion of the electromagnetic energy into heat energy. Therefore, the magnitude of the electromagnetic signal is attenuated. Finally, a conductive backplane 18 is preferably attached directly to the back of the pyramid structure 14. This backplane 18 provides a thermal conduction path to remove the converted energy.

In the present invention, the graded dielectric, pyramid shaped absorber 14 comprises a conductive loaded resin-based material. In one embodiment, the pyramid structure 14 comprises a non-foamed resin-based material. In another embodiment, the pyramid structure 14 comprises a foamed resin-based material. In another embodiment, the pyramid structure 14 comprises a resin-based material that is covered with a thin layer, or sheet, not shown, of conductive loaded resin-based material. Further, in that embodiment, it is preferred that the inner region comprise a foamed resin-based material. It is found that the above-described compositions result in a superior absorbing structure. The conductive loaded resin-based material of the present invention exhibits a high dielectric level and exhibits a well-controlled resistance based on the percentage, by weight, of the conductive loading materials used. Further, flame retardant base resin materials may be easily used to create flame retardant absorbers. This is a distinct advantage over prior art polyurethane foam systems. In another embodiment of the present invention, a backplane 18 is attached to the pyramid-style absorber. This backplane 18 comprises a metal layer in one embodiment. In another embodiment, the backplane 18 comprises the conductive loaded resin-based material of the present invention. In this case, the backplane 18 preferably comprises a highly conductive formulation with a high percentage of conductive material.

Figure 7:
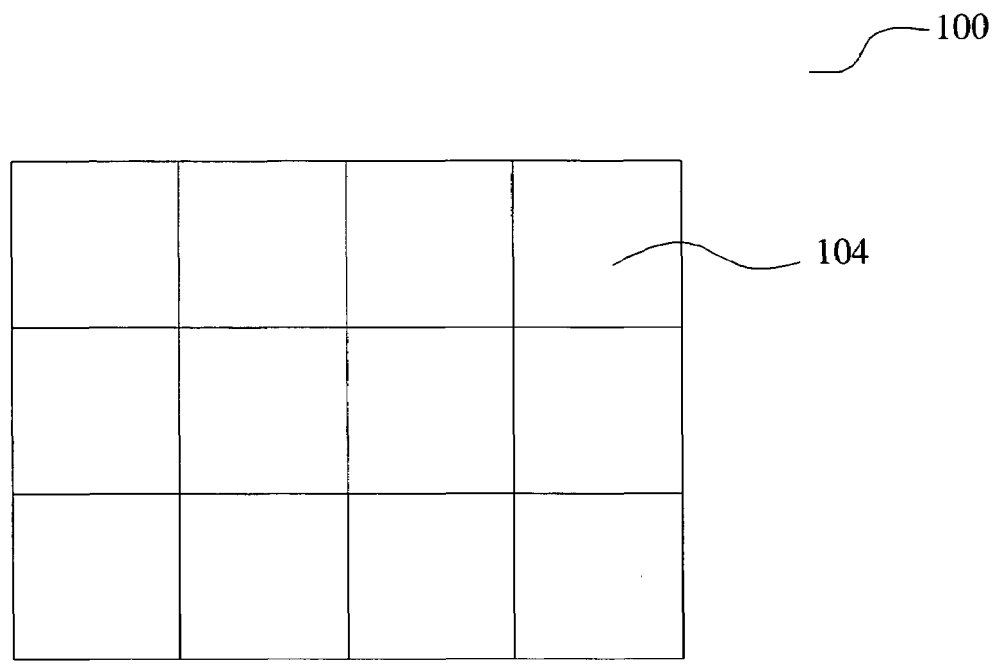
FIG. 7 illustrates a second preferred embodiment of the present invention showing electromagnetic energy absorbing tiles comprising a conductive loaded resin-based material.

Referring now to FIG. 7, a second preferred embodiment 100 of the present invention is illustrated. Electromagnetic energy absorbing tiles 104 comprising a conductive loaded resin-based material are shown. In the prior art, magnetic energy absorbing tiles typically comprise a ferrite material. This material interacts with the magnetic field of the electromagnetic energy to convert this energy into heat. In the present invention, the conductive loaded resin-based material of the tiles 104 is formulated with a loading, such as iron, that will interact with the incident magnetic field and convert the energy to heat. In anther embodiment of the present invention, the tiles 104 comprise a non-magnetic conductive loading material.

Figure 8:
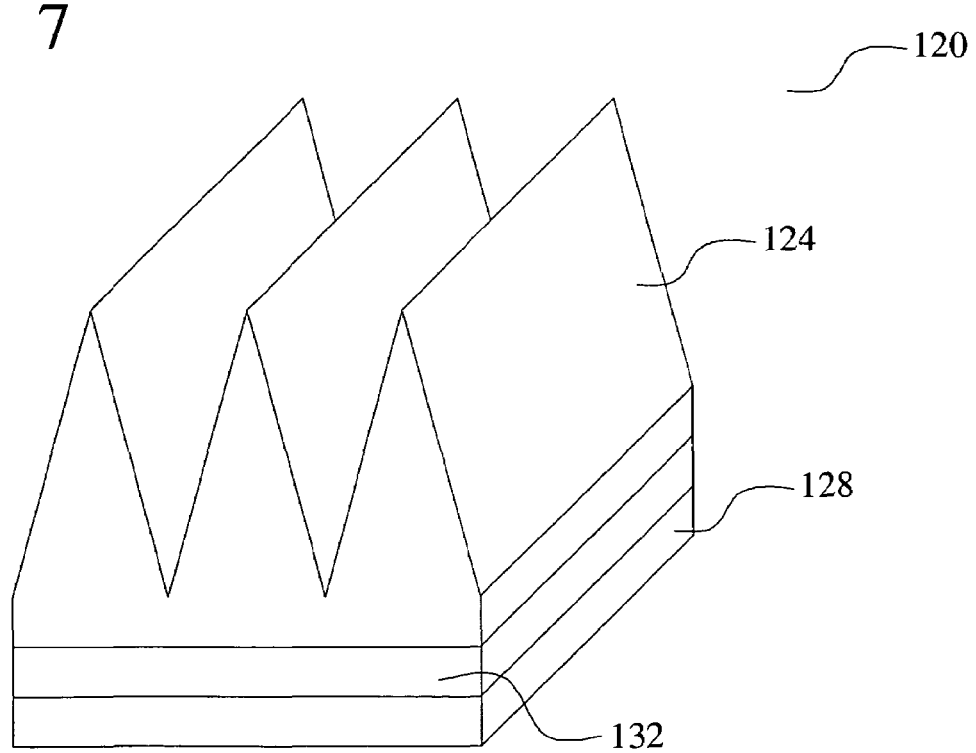
FIG. 8 illustrates a third preferred embodiment of the present invention showing combined pyramidal and tiled electromagnetic energy absorbers comprising a conductive loaded resin-based material.

Referring now to FIG. 8, a third preferred embodiment 120 of the present invention is illustrated. Combined, pyramidal and tiled electromagnetic energy absorbers comprising a conductive loaded resin-based material are shown. These absorbers 120 comprise a pyramid structure 124, a tile structure 132, and a backplane structure 128. In one embodiment, the graded dielectric, pyramid shaped absorber 124 comprises a conductive loaded resin-based material as defined in the present invention. In another embodiment, the pyramid structure 124 comprises a non-foamed resin-based material. In another embodiment, the pyramid structure 124 comprises a foamed resin-based material. In another embodiment, the pyramid structure 124 comprises a resin-based material that is covered with a thin layer, or sheet, not shown, of conductive loaded resin-based material. Further, in that embodiment, it is preferred that the inner region 124 comprise a foamed resin-based material.

In one embodiment of the present invention according to FIG. 8, the tile 132 is formulated of conductive loaded resin-based material with a conductive loading, such as iron, that will interact with the incident magnetic field and convert the energy to heat. In anther embodiment of the present invention, the tile 132 comprises a conductive loaded resin-based material loaded where the conductive load is a non-magnetic material. In another embodiment of the present invention, the backplane 128 comprises a metal layer. In another embodiment, the backplane 128 comprises the conductive loaded resin-based material of the present invention. In this case, the backplane 128 preferably comprises a highly conductive formulation with a high percentage of conductive material. Finally, the pyramid structure 124, tile 132, or backplane 128, or combinations of any thereof, comprise the conductive loaded resin-based material according to the present invention.

Figure 9:
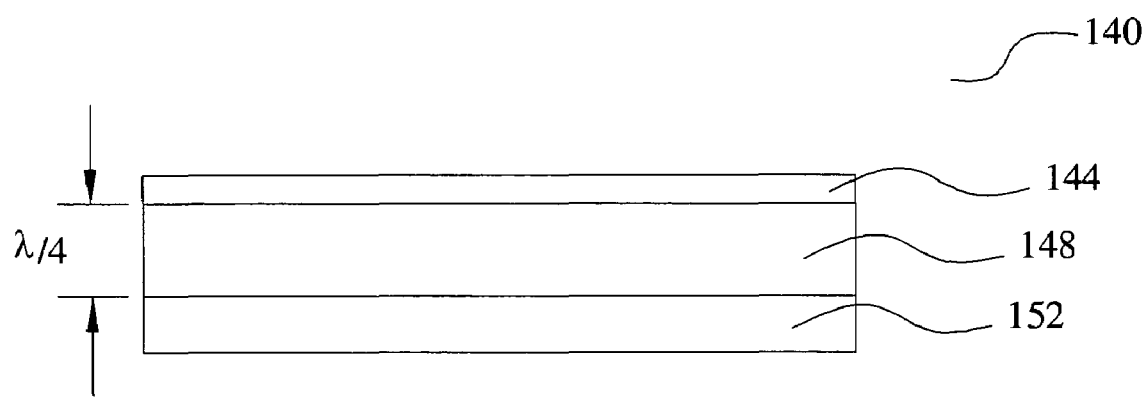
FIG. 9 illustrates a fourth preferred embodiment of the present invention showing a Salisbury-type electromagnetic energy absorber comprising a conductive loaded resin-based material.

Referring now FIG. 9, a fourth preferred embodiment 140 of the present invention is illustrated. A Salisbury-type electromagnetic energy absorber comprising a conductive loaded resin-based material is shown. The Salisbury-type absorber 140 comprises a resistive top layer 144, a space or spacer layer 148, and a conductive ground plane 152. The ground plane 152 is spaced 148 from the resistive plane 152 by about ¼ λ of the nominal energy frequency. An electromagnetic energy wave incident on the resistive top layer 144 is partially reflected and partially absorbed. If absorbed, this wave traverses the space 148 and then is reflected off the ground plane 152. Any wave thus experiencing this second type of reflection is then subject to additional reflections between the resistive layer 144 and the ground plane 152. As a result of the partial transmittance and of the reflections at multiples of quarter wave length, significant absorption and phase canceling occurs. The Salisbury-type absorber 140 is most useful for fixed applications with a very well-defined operating frequency.

In the present invention, the top resistive layer 144 preferably comprises the conductive loaded resin-based material. The conductive loaded resin-based material is formulated to exhibit a somewhat large resistivity by adjusting the percent, by weight, of the conductive loading to the lower end of the working range. In another preferred embodiment, the conductive ground plane 152 comprises the conductive loaded resin-based material at a low resistivity operating point. In yet another preferred embodiment, both the resistive top layer 144 and the ground plane 152 comprises the conductive loaded resin-based material.

Figure 10:
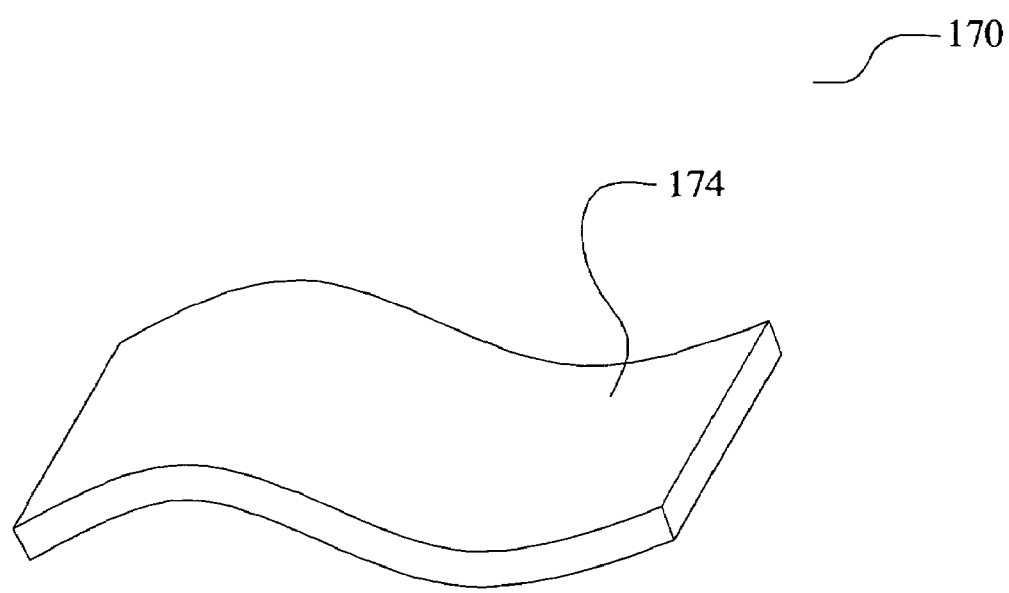
FIG. 10 illustrates a fifth preferred embodiment of the present invention showing a flexible sheeting electromagnetic energy absorber comprising a conductive loaded resin-based material.
Figure 14:
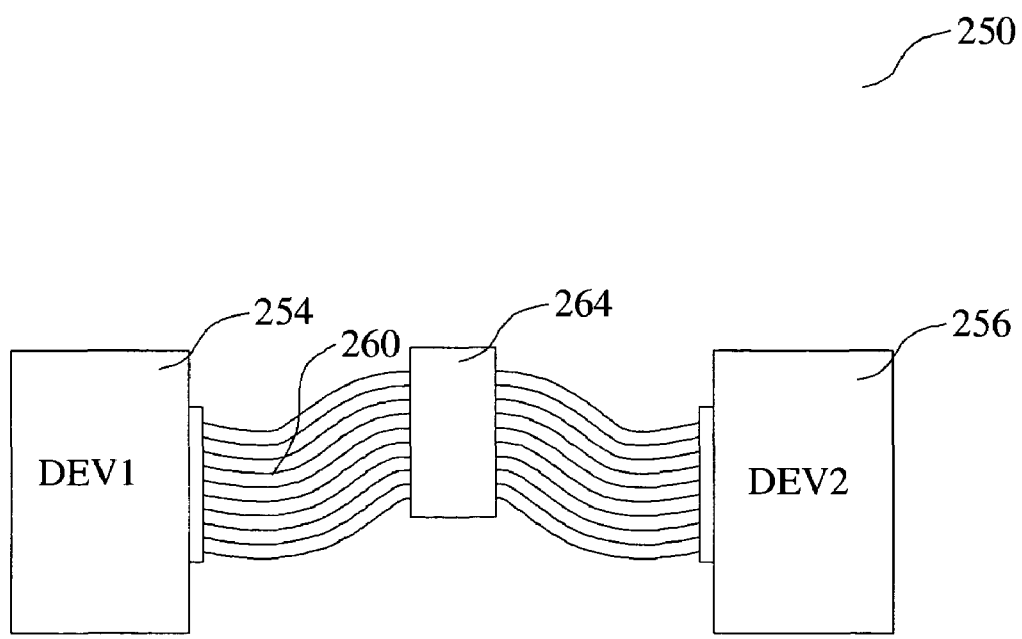
FIG. 14 illustrates a ninth preferred embodiment of the present invention showing the application of an electromagnetic energy absorber comprising a conductive loaded resin-based material to reduce interference on a flat cable.

Referring now to FIG. 10, a fifth preferred embodiment 170 of the present invention is illustrated. A flexible sheeting electromagnetic energy absorber 174 comprising a conductive loaded resin-based material is shown. The flexible sheeting absorber 174 comprises a base resin material that remains flexible after the molding operation. The absorber 174 absorbs incident electromagnetic energy and converts this energy into heat. The flexible sheeting absorber 174 is ideal for applications with complex shapes or where the absorbing device 174 must be added in the field. For example, referring now to FIG. 14, a flat cable 260 provides signal connectivity between a first electronic device DEV1 254 and a second electronic device DEV2 256. According to a ninth preferred embodiment of the present invention, a flexible sheet absorber 264 of the conductive loaded resin-based material is applied around the flat cable 260 to absorb radiated energy.

Figure 11:
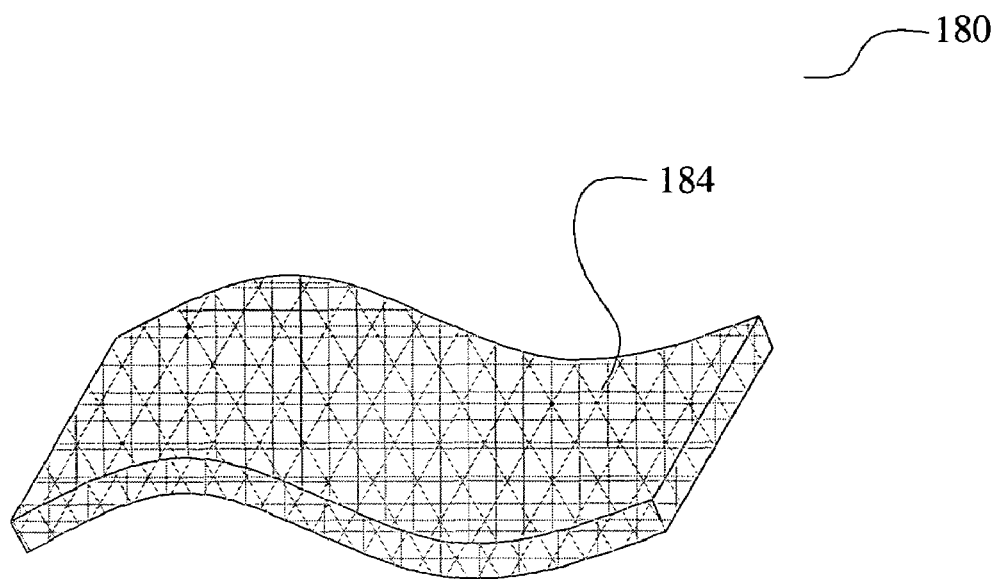
FIG. 11 illustrates a sixth preferred embodiment of the present invention showing a fiber matting electromagnetic energy absorber comprising a conductive loaded resin-based material.

Referring now to FIG. 11, a sixth preferred embodiment 180 of the present invention is illustrated. A broadband netting electromagnetic energy absorber 184 comprising a conductive loaded resin-based material is shown. In this embodiment, threads of the conductive loaded resin-based material are weaved, or webbed, to form a drapeble, lightweight material.

Figure 12:
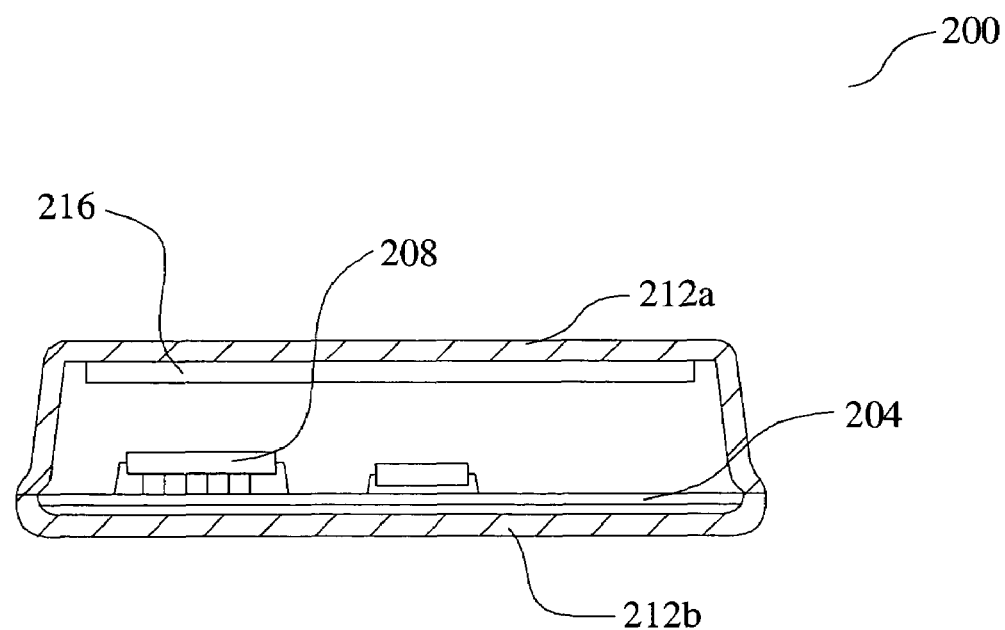
FIG. 12 illustrates a seventh preferred embodiment of the present invention showing the application of an electromagnetic energy absorber comprising a conductive loaded resin-based material to an electronics device.

Referring now to FIG. 12, a seventh preferred embodiment 200 of the present invention is illustrated. The application of an electromagnetic energy absorber 216, comprising a conductive loaded resin-based material, to an electronics device is shown. In this embodiment, an electronic device, such as a portable phone, comprises electronic components, such as integrated circuit devices 208 and a circuit board 204, encased in a housing 212a and 212b. As a feature of the invention, a conductive loaded resin-based electromagnetic absorber 216 is attached, embedded, overmolded, or the like, onto the case. The absorber 216 absorbs electromagnetic energy emitted from the internal circuits 208 and 204. In addition, the absorber absorbs energy from external sources. In one embodiment, the case 212a and 212b comprises resin-based material.

Figure 13:
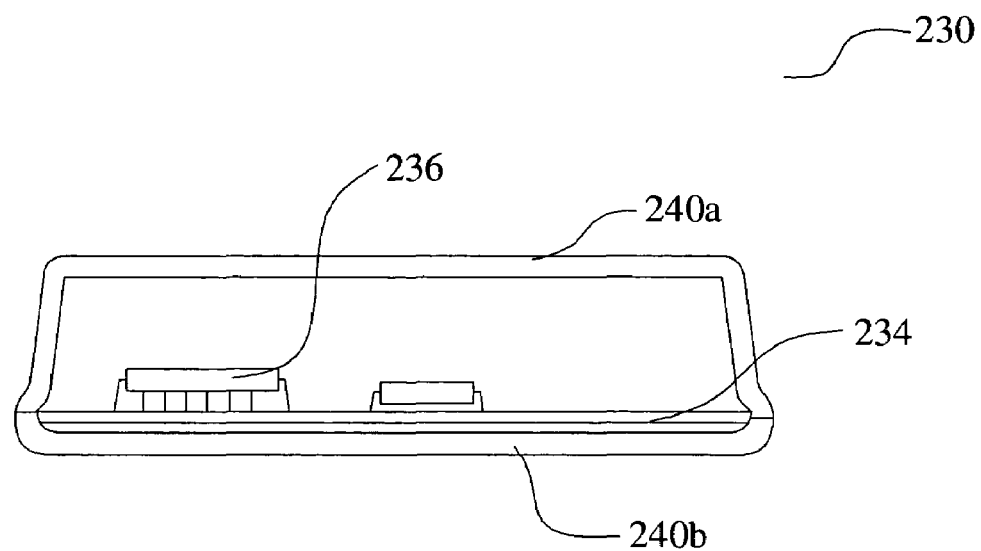
FIG. 13 illustrates an eighth preferred embodiment of the present invention showing a package of an electronics device having an integrated electromagnetic energy absorber comprising a conductive loaded resin-based material.

Referring now to FIG. 13 an eighth preferred embodiment 230 of the present invention is illustrated. In this embodiment, the top case 240a and/or bottom case 240b is an integrated conductive loaded resin-based electromagnetic absorber. The absorber 240a and 240b absorbs electromagnetic energy emitted from the internal circuits 236 and 234. In addition, the absorber absorbs energy from external sources.

Referring now to FIG. 15 a tenth preferred embodiment 270 of the present invention is illustrated. A spiral shaped electromagnetic energy absorber 284 comprising a conductive loaded resin-based material is applied to a power cord 278 and 280 for an electronics device to reduce electromagnetic interference on the cord 278 and 280. In one embodiment, the spiral shaped absorber 284 uses a flexible base resin. In another embodiment, the spiral shaped absorber 284 further comprises an insulating layer overlying the conductive loaded resin-based material.

Referring now to FIG. 16, an eleventh preferred embodiment 300 of the present invention is illustrated. The application of electromagnetic energy absorbers 320 and 328 comprising conductive loaded resin-based material according to the present invention is extended to a communications antenna. Masts, or towers, 304 are frequently employed to provide clear line-of-sight locations for communications antennas, such as are used in cellular mobile phones. In the exemplary illustration, a set of antennas for transmitting 308a–c and receiving 312a–c is mounted onto a tower 304. Frequently, several sets of antennas, operating at different frequencies, will be mounted onto a common tower to reduce cost. Unfortunately, the antenna sets may interfere with each other. To reduce this interference problem, a flexible sheeting 320 of the conductive loaded resin-based absorber 320 is wrapped around the tower 304 to reduce EMI/RFI transfer between antennas through the tower 304. In another embodiment, the conductive loaded resin-based absorber 328 is placed inside the tower steel 324, as shown in the inset cross-section, to thereby reduce EMI/RFI interactions with any signals that are routed in the mast.

The visual, thermal, conductive, or dielectric characteristics of the conductive loaded resin-based absorbers described herein may be altered by forming a metal layer onto the conductive loaded resin-based material according to an optional embodiment of the present invention. If used, the metal layer may be formed by plating or by coating. If the method of formation is metal plating, then the resin-based structural material of the conductive loaded, resin-based material is one that can be metal plated. There are many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer may be formed by, for example, electroplating or physical vapor deposition.

Figure 2:
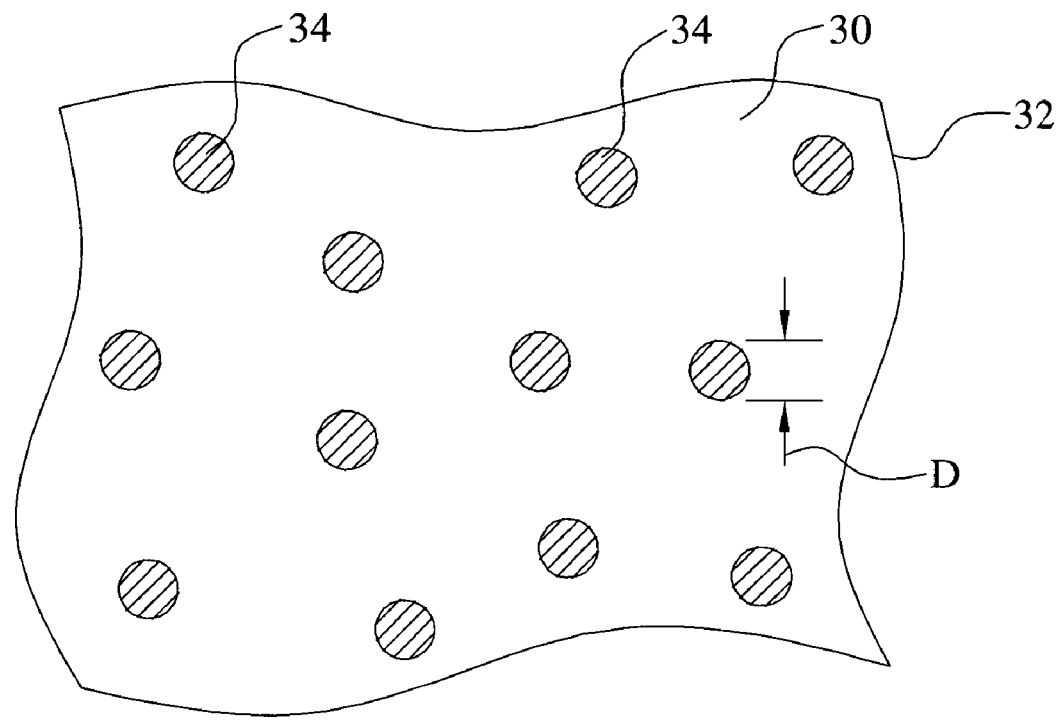
FIG. 2 illustrates a first preferred embodiment of a conductive loaded resin-based material wherein the conductive materials comprise a powder.

The conductive loaded resin-based material typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
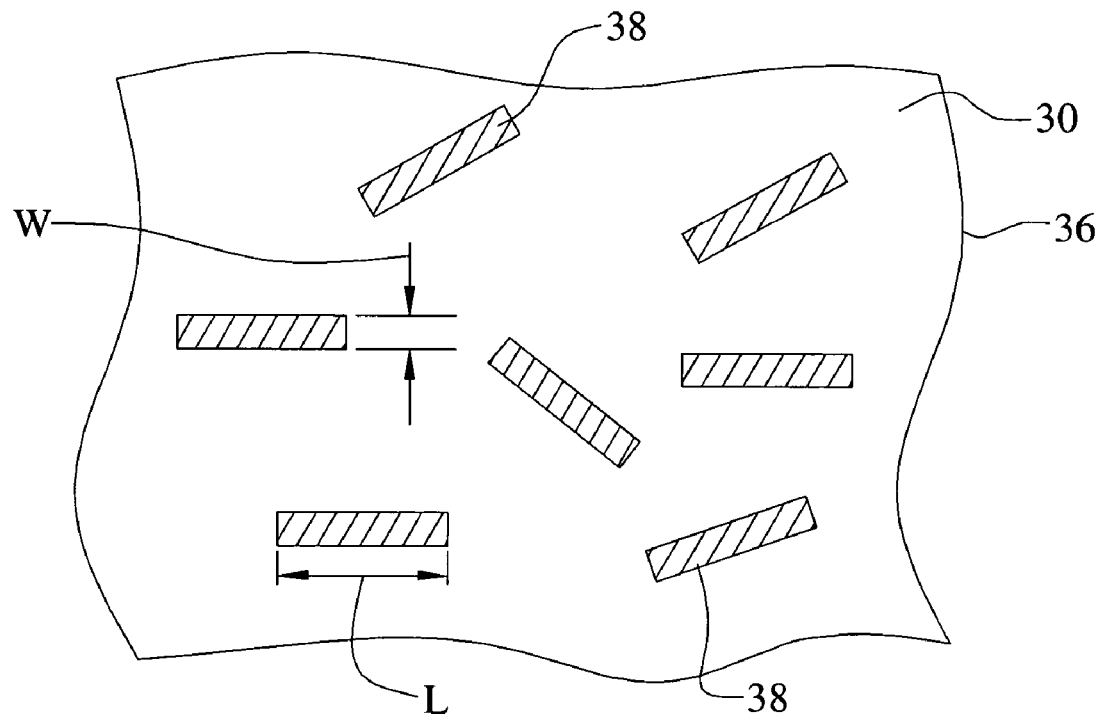
FIG. 3 illustrates a second preferred embodiment of a conductive loaded resin-based material wherein the conductive materials comprise micron conductive fibers.
Figure 4:
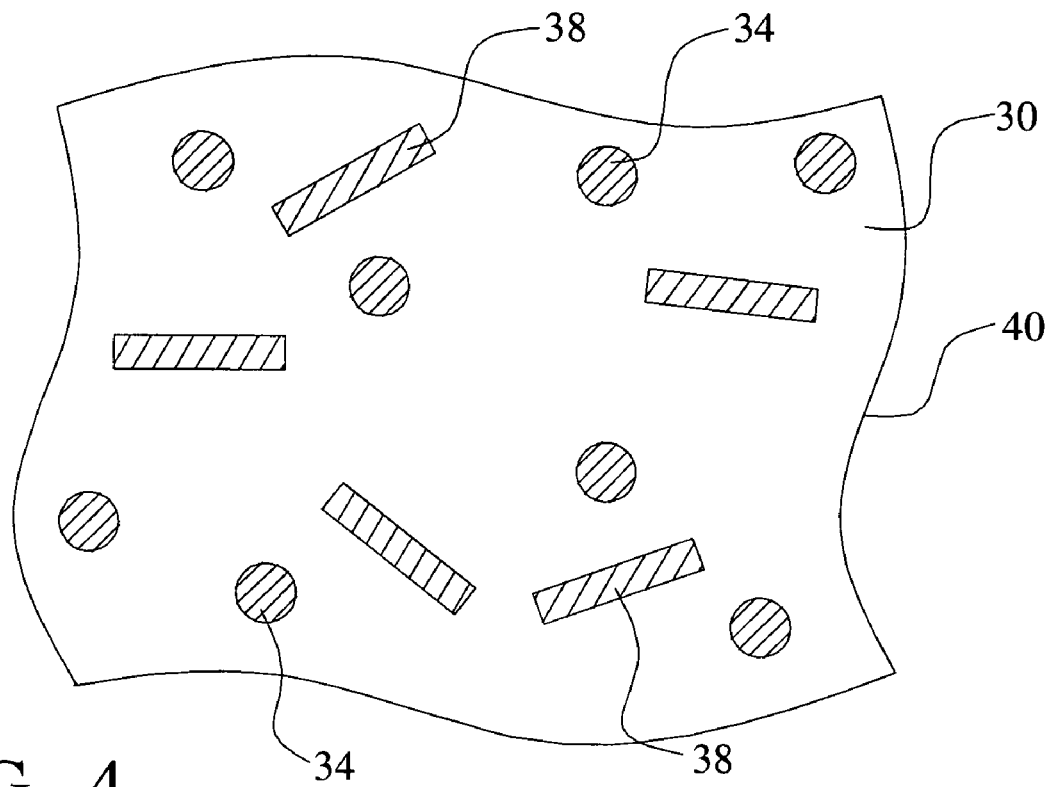
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a sheet resistance between about 5 and 25 ohms per square, other sheet resistances can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 8–11 micron in diameter and lengths of 4–6 mm with a fiber weight of about 30% to to will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
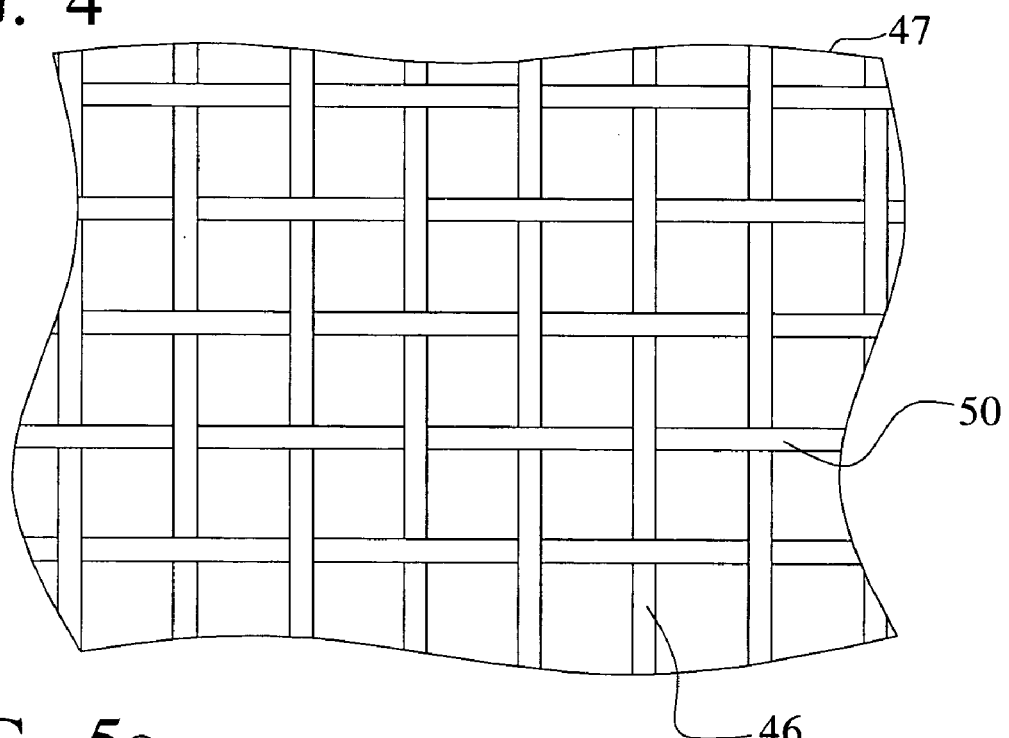
FIGS. 5a and 5b illustrate a fourth preferred embodiment wherein conductive fabric-like materials are formed from the conductive loaded resin-based material.
Figure 5B:
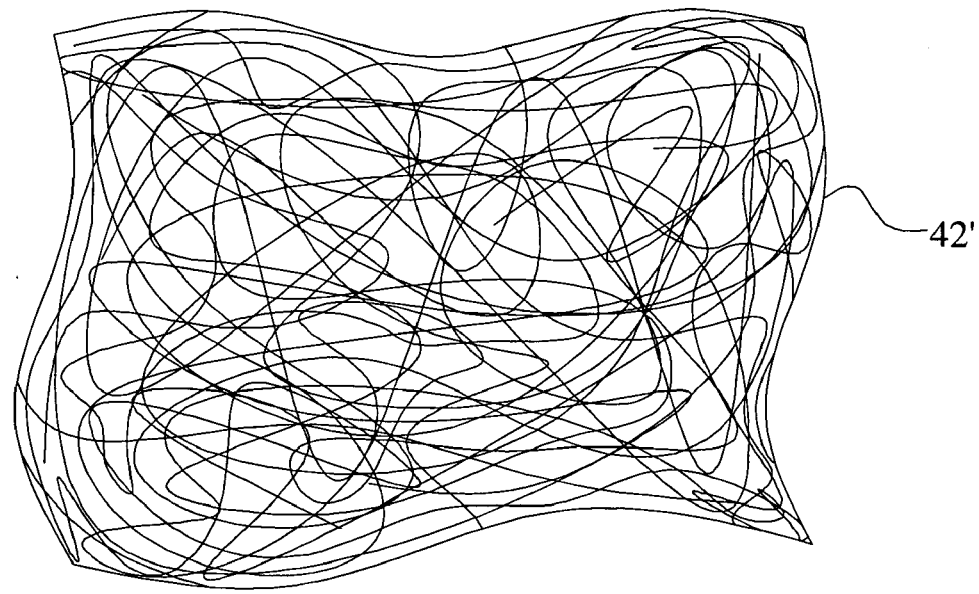

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figures 6A, 6B:
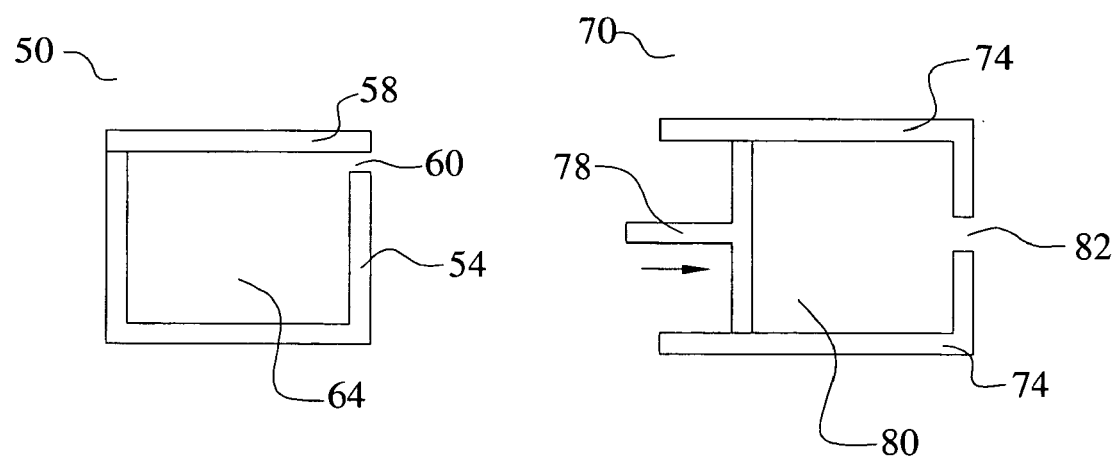
FIGS. 6a and 6b illustrate, in simplified schematic form, an injection molding apparatus and an extrusion molding apparatus that may be used to mold electromagnetic energy absorbers of a conductive loaded resin-based material.

Electromagnetic energy absorbers formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the electromagnetic energy absorbers are removed.

FIG. 6b shows a simplified schematic diagram of an extruder 70 for forming electromagnetic energy absorbers using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. Effective electromagnetic energy absorbers and methods of manufacture are achieved. The electromagnetic energy absorbers are molded of conductive loaded resin-based materials. The electromagnetic energy absorbers characteristics can be altered or the visual characteristics can be altered by forming a metal layer over the conductive loaded resin-based material. Methods to fabricate electromagnetic energy absorbers from a conductive loaded resin-based material incorporating various forms of the material are described. A method is described to fabricate electromagnetic energy absorbers from a conductive loaded resin-based material where the material is in the form of a fabric.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. An electromagnetic energy absorbing device comprising:
   a shaped section comprising a conductive loaded, resin-based material comprising conductive materials in a base resin host wherein said conductive materials comprise between about 20% and about 50% of the total weight of said conductive loaded resin-based material and wherein said conductive materials comprise micron conductive fiber; and a conductive backplane section attached the base of said pyramidal shaped section.

2. The device according to claim 1 wherein said conductive materials comprise between about 20% and about 40% of the total weight of said conductive loaded resin-based material.

3. The device according to claim 1 wherein said conductive materials comprise between about 25% and about 35% of the total weight of said conductive loaded resin-based material.

4. The device according to claim 1 wherein said conductive materials comprise about 30% of the total weight of said conductive loaded resin-based material.

5. The device according to claim 1 wherein said conductive materials further comprise metal powder.

6. The device according to claim 5 wherein said metal powder is nickel, copper, or silver.

7. The device according to claim 5 wherein said metal powder is a non-conductive material with a metal plating.

8. The device according to claim 7 wherein said metal plating is nickel, copper, silver, or alloys thereof.

9. The device according to claim 5 wherein said metal powder comprises a diameter of between about 3 µm and about 12 µm.

10. The device according to claim 1 wherein said conductive materials further comprise non-metal powder.

11. The device according to claim 10 wherein said non-metal powder is carbon, graphite, or an amine-based material.

12. The device according to claim 1 wherein said conductive materials further comprise a combination of metal powder and non-metal powder.

13. The device according to claim 1 wherein said micron conductive fiber is nickel plated carbon fiber, stainless steel fiber, copper fiber, silver or combinations thereof.

14. The device according to claim 1 wherein said micron conductive fiber has a diameter of between about 3 µm and about 12 µm and a length of between about 2 mm and about 14 mm.

15. The device according to claim 1 further comprising an electrically insulating layer surrounding said electromagnetic energy absorbing device.

16. The device according to claim 15 wherein said electrically insulating layer is a resin-based material.

17. The device according to claim 1 wherein said electromagnetic energy absorbing device is flexible.

18. The device according to claim 1 further comprising a metal layer overlying a part of said electromagnetic energy absorbing device.

19. The device according to claim 1 wherein said electromagnetic energy absorbing device comprises a spiral shape.

20. The device according to claim 1 wherein said electromagnetic energy absorbing device comprises a pyramidal shape.

21. The device according to claim 1 wherein said base resin host comprises a foamed material.

22. The device according to claim 1 wherein said conductive backplane section comprises said conductive loaded, resin-based material.

23. The device according to claim 1 further comprising a magnetic energy absorbing tile placed between said shaped section and said conductive backplane section.

24. The device according to claim 23 wherein said magnetic energy absorbing tile comprises said conductive loaded, resin-based material.

25. The device according to claim 1 wherein said electromagnetic energy absorbing device is integrated into an electronics package.

26. An electromagnetic energy absorbing device comprising:

a shaped section comprising a conductive loaded, resin-based material comprising conductive materials in a base resin host wherein said conductive materials comprise between about 20% and about 50% of the total weight of said conductive loaded resin-based material and wherein said conductive materials comprise micron conductive fibers and wherein said conductive loaded resin-based material is covered by a metal layer; and a conductive backplane section attached the base of said pyramidal shaped section.

27. The device according to claim 26 wherein said conductive materials comprise between about 20% and about 40% of the total weight of said conductive loaded resin-based material.

28. The device according to claim 26 wherein said conductive materials comprise between about 25% and about 35% of the total weight of said conductive loaded resin-based material.

29. The device according to claim 26 wherein said conductive materials comprise about 30% of the total weight of said conductive loaded resin-based material.

30. The device according to claim 26 wherein said conductive materials further comprise metal powder.

31. The device according to claim 30 wherein said metal powder is a non-conductive material with a metal plating.

32. The device according to claim 30 wherein said metal powder comprises a diameter of between about 3 µm and about 12 µm.

33. The device according to claim 26 wherein said conductive materials further comprise non-metal powder.

34. The device according to claim 26 wherein said conductive materials further comprise a combination of metal powder and non-metal powder.

35. The device according to claim 26 wherein said micron conductive fiber is nickel plated carbon fiber, stainless steel fiber, copper fiber, silver fiber or combinations thereof.

36. The device according to claim 26 wherein said micron conductive fiber has a diameter of between about 3 µm and about 12 µm and a length of between about 2 mm and about 14 mm.

37. The device according to claim 26 further comprising an electrically insulating layer surrounding said electromagnetic energy absorbing device.

38. The device according to claim 37 wherein said electrically insulating layer is a resin-based material.

39. The device according to claim 26 wherein said electromagnetic energy absorbing device is flexible.

40. The device according to claim 26 further comprising a metal layer overlying a part of said electromagnetic energy absorbing device.

41. The device according to claim 26 wherein said electromagnetic energy absorbing device comprises a spiral shape.

42. The device according to claim 26 wherein said electromagnetic energy absorbing device comprises a pyramidal shape.

43. The device according to claim 26 wherein said base resin host comprises a foamed material.

44. The device according to claim 26 wherein said conductive backplane section comprises said conductive loaded, resin-based material.

45. The device according to claim 26 further comprising a magnetic energy absorbing tile placed between said shaped section and said conductive backplane section.

46. The device according to claim 45 wherein said magnetic energy absorbing tile comprises said conductive loaded, resin-based material.

47. The device according to claim 26 wherein said electromagnetic energy absorbing device is integrated into an electronics package.

48. A method to form a resistive element device, said method comprising:
   providing a conductive loaded, resin-based material comprising conductive materials in a resin-based host wherein said conductive materials comprise micron conductive fiber; and
   molding said conductive loaded, resin-based material into an electromagnetic energy absorbing device comprising:
      a shaped section; and
      a conductive backplane section attached the base of said pyramidal shaped section.

49. The method according to claim 48 wherein said conductive materials comprise between about 20% and about 50% of the total weight of said conductive loaded resin-based material.

50. The method according to claim 48 wherein said conductive materials comprise between about 20% and about 40% of the total weight of said conductive loaded resin-based material.

51. The method according to claim 48 wherein said conductive materials comprise between about 25% and about 35% of the total weight of said conductive loaded resin-based material.

52. The method according to claim 48 wherein said conductive materials comprise about 30% of the total weight of said conductive loaded resin-based material.

53. The method according to claim 48 wherein the conductive materials further comprise a conductive powder.

54. The method according to claim 48 wherein said molding comprises:
   injecting said conductive loaded, resin-based material into a mold;
   curing said conductive loaded, resin-based material; and
   removing said electromagnetic energy absorbing device from said mold.

55. The method according to claim 48 further comprising forming an electrically insulating layer over said electromagnetic energy absorbing device.

56. The method according to claim 55 wherein said step of forming an electrically insulating layer comprises overmolding.

57. The method according to claim 55 wherein said step of forming an electrically insulating layer comprises dipping, spraying, or coating.

58. The method according to claim 48 wherein said molding comprises:
   loading said conductive loaded, resin-based material into a chamber;
   extruding said conductive loaded, resin-based material out of said
   chamber through a shaping outlet; and
   curing said conductive loaded, resin-based material to form said electromagnetic energy absorbing device.

59. The method according to claim 48 further comprising stamping or milling said molded conductive loaded, resin-based material.

60. The method according to claim 48 further comprising forming a metal layer overlying said electromagnetic energy absorbing device.

* * * * *